(12) United States Patent
Seesink et al.

(10) Patent No.: US 8,217,475 B2
(45) Date of Patent: Jul. 10, 2012

(54) BACKSIDE CONTROLLED MEMS CAPACITIVE SENSOR AND INTERFACE AND METHOD

(75) Inventors: Peter Seesink, Oudoorp (NL); Omar Abed, Moorpark, CA (US)

(73) Assignee: Custom Sensors & Technologies, Inc., Moorpark, CA (US)

( * ) Notice: Subject to any disclaimer, the term of this patent is extended or adjusted under 35 U.S.C. 154(b) by 301 days.

(21) Appl. No.: 12/121,070

(22) Filed: May 15, 2008

(65) Prior Publication Data

US 2009/0283846 A1 Nov. 19, 2009

(51) Int. Cl.
*H01L 29/94* (2006.01)
(52) U.S. Cl. ......... 257/419; 257/E29.325; 257/E29.342; 257/E29.345
(58) Field of Classification Search ............... 257/419
See application file for complete search history.

(56) References Cited

U.S. PATENT DOCUMENTS

| | | | |
|---|---|---|---|
| 5,377,524 A * | 1/1995 | Wise et al. ............. | 73/1.34 |
| 5,919,548 A | 7/1999 | Barron | |
| 5,929,497 A | 7/1999 | Chavan | |
| 5,936,164 A * | 8/1999 | Sparks et al. ............. | 73/724 |
| 6,012,336 A * | 1/2000 | Eaton et al. ............. | 73/754 |
| 6,109,113 A | 8/2000 | Chavan | |
| 6,149,190 A | 11/2000 | Galvin | |
| 6,239,473 B1 | 5/2001 | Adams | |
| 6,460,234 B1 | 10/2002 | Gianchandani | |
| 6,880,406 B2 | 4/2005 | Yang | |
| 7,114,397 B2 | 10/2006 | Fortin | |
| 7,152,474 B2 | 12/2006 | Deb | |
| 7,270,012 B2 | 9/2007 | Yokoyama | |
| 2006/0063354 A1 * | 3/2006 | Fortin et al. ............. | 438/459 |
| 2007/0029629 A1 | 2/2007 | Yazdi | |
| 2007/0138584 A1 | 6/2007 | Fortin | |
| 2007/0190680 A1 | 8/2007 | Fukuda | |
| 2007/0251339 A1 * | 11/2007 | Wiese et al. ............. | 73/866.1 |
| 2008/0087069 A1 * | 4/2008 | Renken et al. ............. | 73/1.63 |

OTHER PUBLICATIONS

Fedder, Gary K., "Structured Design of Integrated MEMS," Twelfth IEEE International Conference on Micro Electro Mechanical Systems, Orlando, FL, USA, pp. 1-8, Jan. 1999.
Eaton, W.P. et al., "Micromachined pressure sensors: review and recent developments," Smart Mater. Stuct. 6, 530-539, IOP Publishing Ltd. 1997, UK.
You, Liang, WO2007/047571 A2, "Integrated CMOS-MEMS Technology for Wired Implantable Sensors," Apr. 26, 2007.

* cited by examiner

*Primary Examiner* — Nathan Ha
*Assistant Examiner* — Abul Kalam
(74) *Attorney, Agent, or Firm* — Gilman Clark & Hunter LLC

(57) ABSTRACT

Described herein is the sense element assembly for a capacitive pressure sensor and method for creating same that has increased sensitivity despite the parasitic capacitance that is created. The capacitive sensor element assembly, comprises a first semiconductive layer, and a first conductive layer, a first dielectric layer into which a cavity has been formed, the dielectric layer lying between the first semiconductive layer and the first conductive layer, wherein an electrical connection is made to the second conductive layer. A preferred method for fabricating a capacitive sensor assembly of the present invention comprises the steps of forming a dielectric layer on top of a conductive handle wafer; creating at least one cavity in the dielectric layer, bonding a thin semiconductive layer to the dielectric layer and connecting an operational amplifier to the input of the capacitive sensor assembly to overcome the parasitic capacitance formed during fabrication.

14 Claims, 2 Drawing Sheets

BACKSIDE CONTROLLED MEMS CAPACITIVE SENSOR AND INTERFACE AND METHOD

FIELD OF THE INVENTION

The present invention relates generally to MEMS capacitive sensors and more specifically to the sense element assemblies and methods of creating same for MEMS capacitive sensors.

BACKGROUND OF THE INVENTION

MEMS capacitive pressure sensors are well known in the art. In order to maintain maximum sensitivity of the sensor, the sensor has to either be very large so the ratio of sense capacitance to parasitic capacitance is favorable, be constructed so that it reduces parasitic capacitance, or be attached to a circuit that makes it insensitive to the noise and parasitic capacitance.

SUMMARY OF THE PREFERRED EMBODIMENT AND METHOD

In a preferred embodiment of the present invention, a MEMS capacitive sensor element assembly is provided having a semiconductor layer, a dielectric layer into which a cavity has been formed and a conductive layer. The assembly further comprises an electrical connection to the conductive layer.

In a preferred method of the present invention a first wafer assembly and a second wafer assembly are fabricated from which a capacitive sensor element assembly is formed. The first wafer assembly is fabricated having a thick conductive substrate onto which a thin layer of oxide is placed. At least one cavity is formed in the thin layer of oxide. The second wafer assembly is an SOI wafer having a thin upper silicon layer, a thin oxide layer and a thick silicon layer. The first wafer assembly and the second wafer assembly are then bonded together so that the thin oxide layer of the first wafer assembly and the thin silicon layer of the second oxide layer are bonded together. In a preferred method of the present invention, the thick silicon and oxide layers of the second wafer assembly are removed.

BRIEF DESCRIPTION OF THE DRAWINGS

The invention may be more readily understood by referring to the accompanying drawings in which.

Like numerals refer to like parts throughout the several views of the drawings.

DETAILED DESCRIPTION OF THE PREFERRED EMBODIMENTS

In the following descriptions of the invention, terms such as "front," "back," "top," "bottom," "side," and the like are used herein merely for ease of description and refer to the orientation of the components as shown in the Figures.

Figure 1:
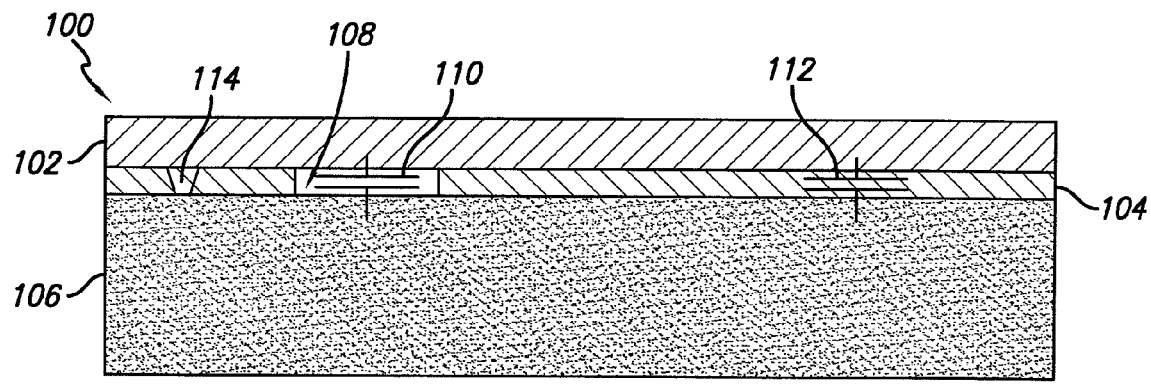
FIG. 1 is a cross sectional elevational view of a preferred embodiment of the capacitive sensor element assembly of the present invention.
Figure 2:
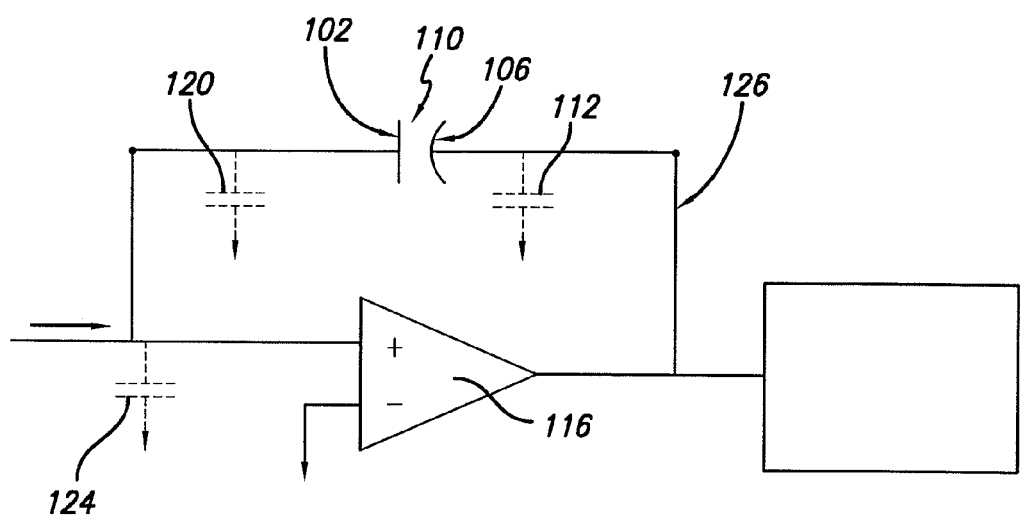
FIG. 2 is schematic diagram of a preferred embodiment of the capacitive sensor element assembly of the present invention.

Generally, the present invention may be briefly described as follows. Referring first to FIGS. 1 and 2, a preferred embodiment of a MEMS capacitive sensor element assembly 100 of the present invention is shown.

The capacitive sensor element assembly 100 comprises a top or device layer 102 a middle layer 104 and a bottom or handle layer 106. The top layer 102 is comprised of a thin semiconductor layer which in a preferred embodiment is a silicon wafer. The bottom layer 106 is comprised of thick conductive layer and in a preferred embodiment it is a conductive silicon handle wafer. In a preferred embodiment, the middle layer 104 is comprised of oxide. However, any material which acts as a dielectric can be used as the middle layer 104.

A cavity 108 is formed in the middle layer 104 by either etching or by masking the layer 104. However, any suitable method for creating a cavity 108 in the middle layer 104 may be used.

In a preferred method of the present invention, the capacitive sensor element assembly 100 is formed by taking a bulk conductive silicon wafer 106 and growing oxide on the top thereof to form layer 104. A cavity 108 is made in layer 104 to form an area where a capacitor 110 will be formed.

The layer 104 is then bonded to an SOI wafer (not shown) so that the interface layers are layer 104 and the thin silicon layer 102 of the SOI wafer. In a preferred method, the bonding is accomplished by fusing the interface layers together such as by eutectic or anodic bonding. However, any process which provides a strong bond and produces a vacuum in the cavity areas may be used.

Thereafter, the handle wafer and the oxide wafer of the SOI wafer are removed so that the only layer remaining from the SOI wafer is the top thin silicon layer 102. A backside contact 114 (shown in FIG. 3) is formed between the top silicon layer 102 and the bottom silicon layer 106.

Because the handle wafer 106 is all conductive, there is a large area where parasitic capacitance 112 exists. Specifically, $C_{sense}$ is in parallel with $C_{parasitic}$ as shown in FIGS. 1 and 2. Further:

$$\frac{C_{parasitic}}{C_{sense}} = \frac{Q_{parasitic}}{Q_{sense}}$$

This is the equation that describes the operation of the entire sensor and attached circuitry as shown in FIG. 2.

Thus, in order to make the sensor 100 more sensitive, the $C_{parasitic}$ must be either isolated or controlled or $C_{sense}$ will be drowned out by $C_{parasitic}$.

Figure 3:
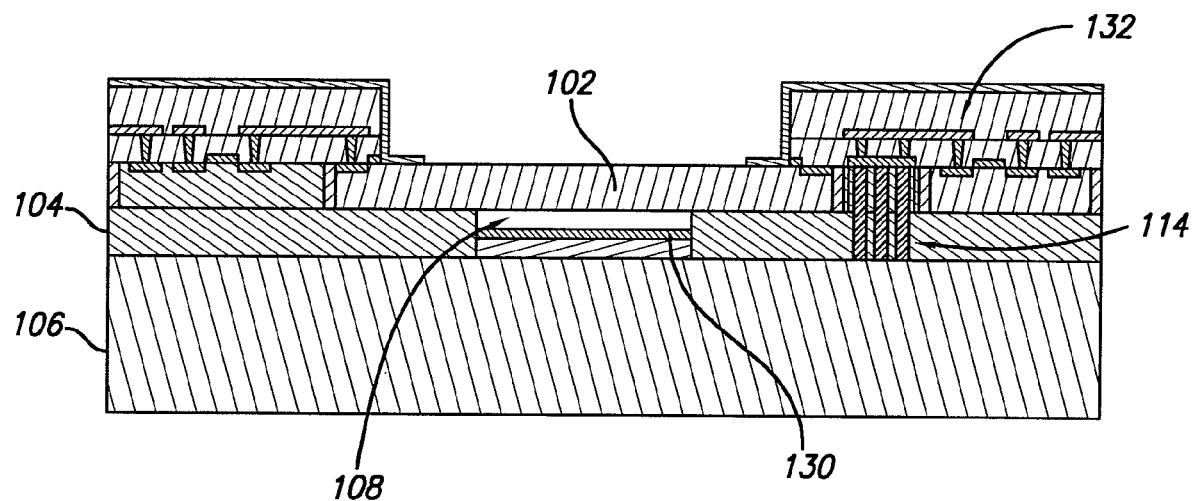
FIG. 3 is a cross sectional elevational view of a preferred embodiment of the capacitive sensor element of the present invention.

Referring specifically to FIG. 2, a schematic diagram of FIG. 3 is shown. The capacitance across the sensor 110 is shown wherein the flat side is connected to the handle wafer 106 and the curved side is connected to the device wafer 102. There are three main parasitic capacitances, the parasitic capacitance 120 of the top wafer 102, the parasitic capacitance 112 of the handle wafer 106 and the parasitic capacitance 124 of the operational amplifier 116. Using this preferred embodiment, the largest capacitance is driven by the operational amplifier 116 and the integration current drives the device layer 102. In this embodiment, the effect of the parasitic capacitance is greatly lessened if not eliminated.

Specifically, the current that goes across the sensor 100 will go up through Node A rather than directly charging the operational amplifier and charges the parasitic capacitance of the top plate and the parasitic capacitance of the operational amplifier as well as the top plate of the sense capacitor. Since it is a closed circuit, the operational amplifier will create enough of a charge to match the charge on the Node A side thereby lessening, if not substantially eliminating the parasitic capacitance formed during fabrication.

Referring next to FIG. 3, a preferred embodiment of the invention is shown. In FIG. 3, cavity 108 has an additional oxide layer 130 on the bottom thereof which is created at vacuum to prevent electrical shorting of the two plates of the capacitor 110. Backside contact 114 is shown which provides an electrical connection from substrate 106 to the CMOS 132 formed on top layer 102 which is part of the operational amplifier 116 and other signal conditioning circuitry (not shown).

Figure 4:
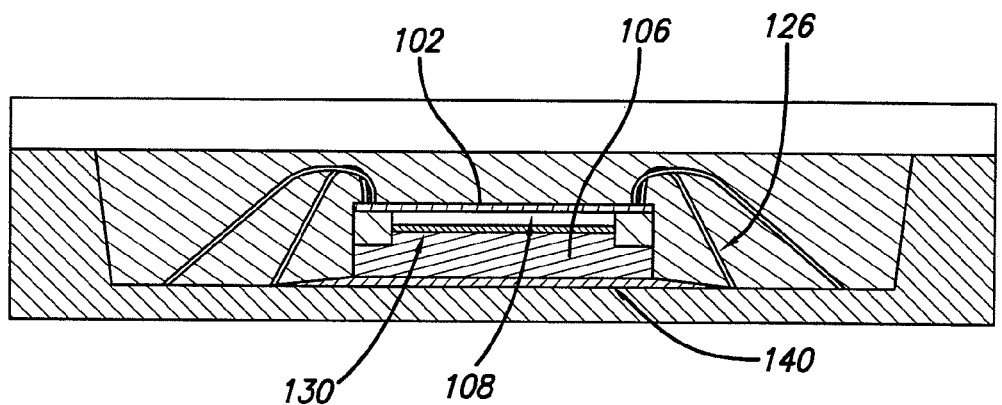
FIG. 4 is a cross sectional elevational view of an alternate preferred embodiment of the capacitive sensor element of the present invention.

Referring next to FIG. 4, an alternate preferred embodiment of the invention is shown. In FIG. 4, cavity 108 has an additional oxide layer 130 on the bottom thereof which is created at vacuum to prevent electrical shorting of the two plates of the capacitor 110 (not shown). The handle wafer 106 is connected to a bottom plate 140 using a conductive attachment such as conducting epoxy, although any conductive attachment or bonding method or material may be used. The op-amp 116 (not shown) on the top layer 102 is connected via an electrical connection 126 to the bottom plate 140 of the package, which in turn is now connected to the handle wafer 106. The bottom plate 140 is a conductive material. However, in a preferred embodiment it is a conductive metallic material.

It will be understood that in the present invention, the sensitivity of the sense assembly 100 will increase without having to increase its overall size.

Those skilled in the art will understand that this type of sensor can be used in the medical, automotive, airplane, heating, ventilating, and air conditioning systems (HVAC) industries, among other applications.

The embodiments and methods described above are exemplary embodiments and methods of the present invention. Those skilled in the art may now make numerous uses of, and departures from, the above-described embodiments and methods without departing from the inventive concepts disclosed herein. Thus, the construction of the embodiments and the steps of the methods disclosed herein are not limitations of the invention. Accordingly, the present invention is to be defined solely by the scope of the following claims.

What is claimed is:

1. A capacitive sensor element assembly, comprising:
   a semiconductive layer,
   a conductive layer,
   a first dielectric layer defining a cavity, the first dielectric layer being disposed between the semiconductive layer and the conductive layer, and
   an operational amplifier with an output terminal electrically connected to the conductive layer of the capacitive sensor element assembly and an input terminal electrically connected to the semiconductive layer of the capacitive sensor element assembly to reduce effects of parasitic capacitance of the capacitive sensor element assembly,
   wherein a conductor is disposed through the first dielectric layer to connect the conductive layer to the semiconductive layer.

2. The capacitive sensor element assembly of claim 1, wherein the operational amplifier is coupled to an input of the conductor.

3. The capacitive sensor element assembly of claim 1 further comprising a second dielectric layer on the bottom of the cavity in the first dielectric layer.

4. The capacitive sensor element assembly of claim 1, wherein the first dielectric layer is a thin layer of oxide.

5. The capacitive sensor element assembly of claim 1 wherein the semiconductive layer is thinner than the conductive layer and the conductive layer is thick enough to support the semiconductive layer and the first dielectric layer.

6. The capacitive sensor element assembly of claim 1, wherein the operational amplifier is disposed on the semiconductive layer and electrically connected to the conductive layer by the conductor electrical connection.

7. A capacitive sensor assembly comprising:
   a semiconductive layer,
   a conductive layer,
   a first dielectric layer defining a cavity, the first dielectric layer-being disposed between the semiconductive layer and the conductive layer,
   an operational amplifier with an output terminal electrically connected to the conductive layer of the capacitive sensor assembly and an input terminal electrically connected to the semiconductive layer of the capacitive sensor assembly to reduce effects of parasitic capacitance of the capacitive sensor assembly, and
   wherein a conductor extends through and electrically connects the conductive layer to the semiconductive layer.

8. The capacitive sensor assembly of claim 7, wherein the operational amplifier is disposed on the semiconductive layer.

9. A capacitive sensor comprising:
   a semiconductive layer,
   a conductive layer,
   a first dielectric layer defining a cavity, the first dielectric layer being disposed between the semiconductive layer and the conductive layer;
   a connecting means for electrically connecting the conductive layer to the semiconductive layer, the connecting means extending through the first dielectric layer to electrically connect the conductive layer to the semiconductive layer; and
   wherein the capacitive sensor is configured to be connected to an operational amplifier with an output terminal electrically connectable to the conductive layer of the capacitive sensor and an input terminal electrically connectable to the semiconductive layer of the capacitive sensor to reduce effects of parasitic capacitance of the capacitive sensor.

10. The capacitive sensor of claim 9, wherein the operational amplifier is electrically coupled to an input of the connecting means.

11. A capacitive sensor element assembly comprising:
    a semiconductive layer,
    a conductive layer underlying the semiconductive layer,
    a first dielectric layer defining a cavity, the first dielectric layer being disposed between the semiconductive layer and the conductive layer,
    a conductor extending through the first dielectric layer to electrically connect the conductive layer to the semiconductive layer, and
    an operational with an output terminal electrically connected to the conductive layer of the capacitive sensor element assembly and an input terminal electrically connected to the semiconductive layer of the capacitive sensor element assembly to reduce effects of parasitic capacitance of the capacitive sensor element assembly.

12. The capacitive sensor element assembly of claim 11, wherein the operational amplifier is coupled to an input of the conductor.

13. The capacitive sensor element assembly of claim 11 further comprising a second dielectric layer on the bottom of the cavity in the first dielectric layer.

14. The capacitive sensor element assembly of claim 11 further comprising a complementary metal-oxide semiconductor (CMOS), wherein the conductor extending through the semiconductive layer electrically connect the conductive layer to the CMOS.

* * * * *